United States Patent
Lin et al.

(10) Patent No.: US 9,190,937 B2
(45) Date of Patent: Nov. 17, 2015

(54) STICTION RESISTANT MEMS DEVICE AND METHOD OF OPERATION

(71) Applicant: FREESCALE SEMICONDUCTOR, INC., Austin, TX (US)

(72) Inventors: Yizhen Lin, Cohoes, NY (US); Andrew C. McNeil, Neukirchen, AZ (US); Mark E. Schlarmann, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 373 days.

(21) Appl. No.: 13/760,465

(22) Filed: Feb. 6, 2013

(65) Prior Publication Data

US 2014/0217929 A1 Aug. 7, 2014

(51) Int. Cl.
*G01P 15/125* (2006.01)
*H02N 1/00* (2006.01)
*B81C 1/00* (2006.01)

(52) U.S. Cl.
CPC ............ *H02N 1/006* (2013.01); *B81C 1/00976* (2013.01); *B81B 2201/0235* (2013.01); *B81B 2203/058* (2013.01)

(58) Field of Classification Search
CPC ............... B81B 2201/0235; B81B 2203/0181; B81C 1/00976
USPC ....................................................... 73/514.32
See application file for complete search history.

(56) References Cited

U.S. PATENT DOCUMENTS

| | | | | |
|---|---|---|---|---|
| 5,353,641 | A | * | 10/1994 | Tang .......................... 73/514.18 |
| 6,520,017 | B1 | * | 2/2003 | Schoefthaler et al. ...... 73/514.02 |
| 6,718,605 | B2 | | 4/2004 | Yazdi et al. |
| 6,997,054 | B2 | * | 2/2006 | Tsugai ........................ 73/514.32 |
| 7,578,190 | B2 | | 8/2009 | Lin et al. |
| 7,610,809 | B2 | | 11/2009 | McNeil et al. |
| 8,322,216 | B2 | | 12/2012 | Yu et al. |
| 2012/0105173 | A1 | | 5/2012 | Schoen et al. |
| 2012/0262241 | A1 | | 10/2012 | Phan Le et al. |

OTHER PUBLICATIONS

Park et al., Capacitive Sensing Type Surface Micromachined Silicon Accelerometer With a Stiffness Tunig Capability, Proc. MEMS 98, pp. 637-642 (1998).*

* cited by examiner

*Primary Examiner* — John Chapman, Jr.
(74) *Attorney, Agent, or Firm* — Charlene R. Jacobsen

(57) ABSTRACT

A MEMS device (20) includes a movable element (20) suspended above a substrate (22) by a spring member (34) having a spring constant (104). A spring softening voltage (58) is applied to electrodes (24, 26) facing the movable element (20) during a powered mode (100) to decrease the stiffness of the spring member (34) and thereby increase the sensitivity of the movable element (32) to an input stimulus (46). Upon detection of a stiction condition (112), the spring softening voltage (58) is effectively removed to enable recovery of the movable element (32) from the stiction condition (112). A higher mechanical spring constant (104) yields a stiffer spring (34) having a larger restoring force (122) in the unpowered mode (96) in order to enable recovery from the stiction condition (112). A feedback voltage (56) can be applied to feedback electrodes (28, 30) facing the movable element (32) to provide electrical damping.

9 Claims, 4 Drawing Sheets

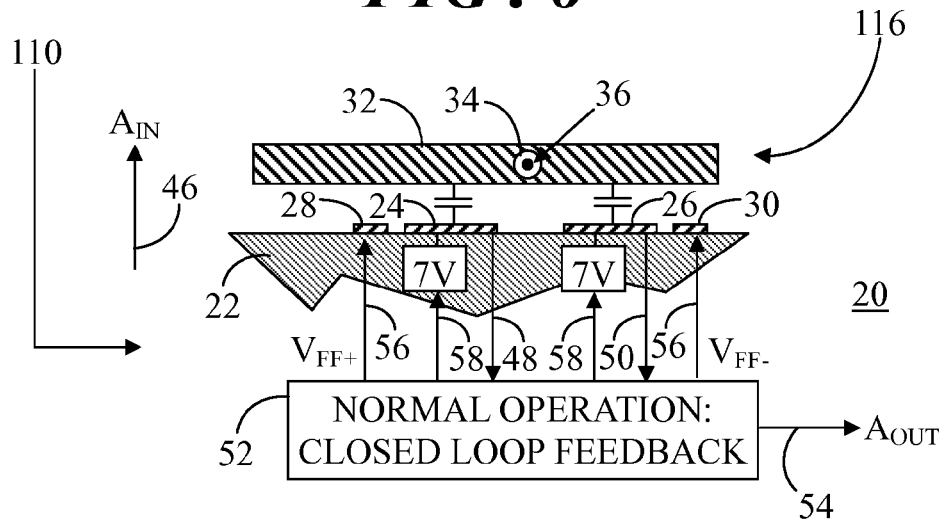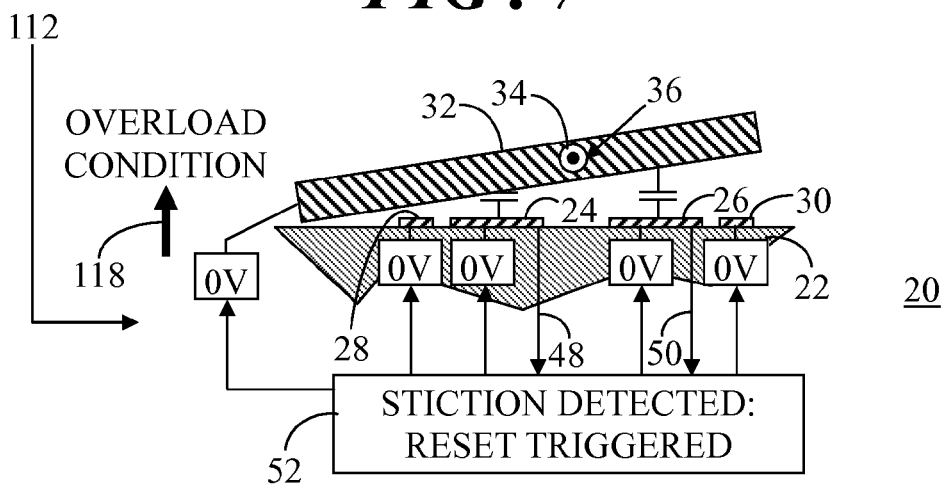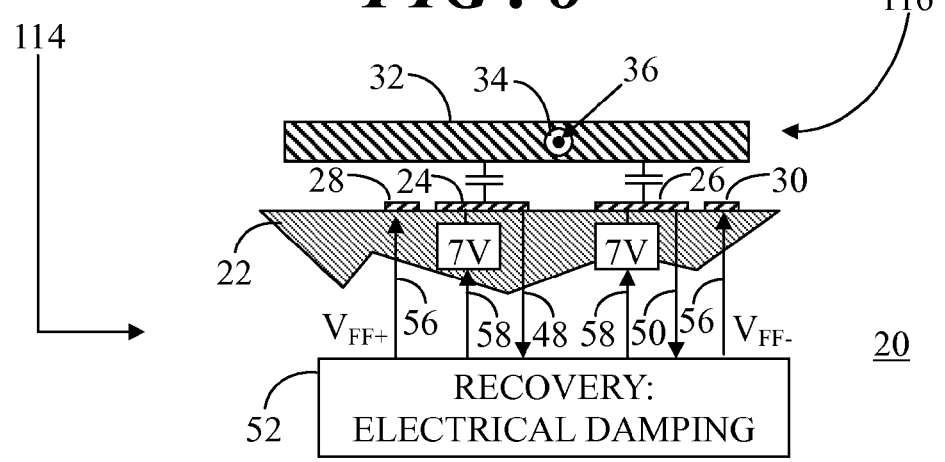

STICTION RESISTANT MEMS DEVICE AND METHOD OF OPERATION

TECHNICAL FIELD OF THE INVENTION

The present invention relates generally to microelectromechanical systems (MEMS) devices. More specifically, the present invention relates to a MEMS device with enhanced resistance to stiction.

BACKGROUND OF THE INVENTION

Advancements in micromachining and other microfabrication techniques and processes have enabled manufacture of a wide variety of microelectronic and microelectromechanical systems (MEMS) devices. One common application of MEMS is the design and manufacture of sensor devices. MEMS sensor devices are widely used in applications such as automotive, inertial guidance systems, household appliances, protection systems for a variety of devices, and many other industrial, scientific, and engineering systems. Such MEMS devices are used to sense a physical condition such as acceleration, angular rate, pressure, temperature, and so forth, and to provide an electrical signal representative of the sensed physical condition.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 6 shows a block diagram of the MEMS device experiencing normal operation;

FIG. 7 shows a block diagram of the MEMS device experiencing a stiction condition; and FIG. 8 shows a block diagram of the MEMS device undergoing a recovery event following the stiction condition.

DETAILED DESCRIPTION

Figure 1:
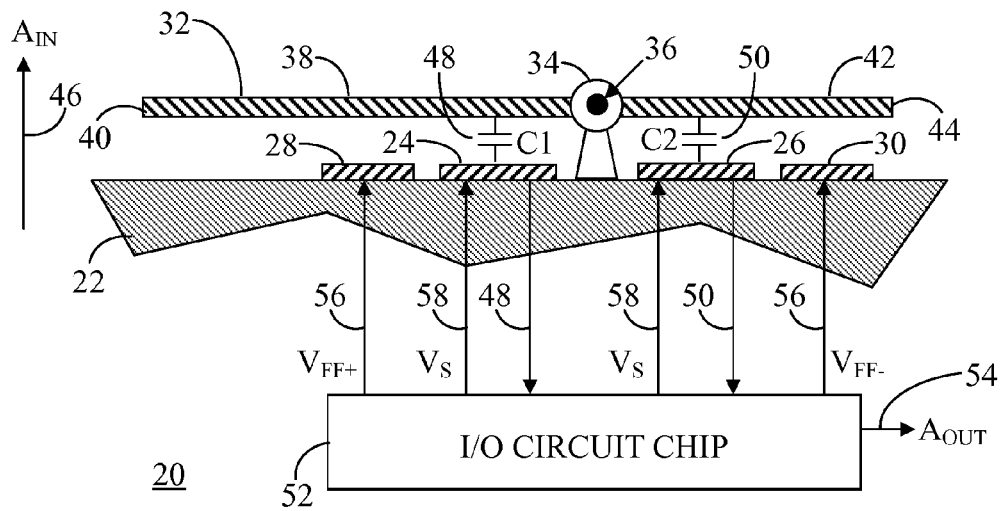
FIG. 1 shows a side view of a microelectromechanical systems (MEMS) device in accordance with an embodiment.

Suspended movable microstructures such as plates and beams are commonly used in the manufacturing of various microelectromechanical systems (MEMS) devices. The suspended microstructures typically have relatively large surface areas with high stiffness. However, the suspension springs for such suspended microstructures may have relatively low stiffness depending upon the application. In addition, the microstructures are typically fabricated a few microns off their supporting substrate. The combination of these characteristics makes MEMS devices susceptible to forces which can deflect the suspended movable microstructures vertically toward the supporting substrate and/or laterally toward surrounding structures or lateral stops. If the deflection force is sufficiently strong, the movable member can come into contact with and temporarily or permanently adhere to the underlying substrate or the lateral structures causing false output signals and/or device failure. The unintentional adhesion of a movable structure is referred to as stiction.

Stiction can occur both during MEMS device fabrication and during normal use. During normal use, stiction can occur if the suspended movable microstructure is placed in temporary or permanent contact with its substrate by external forces, such as mechanical shock. A mechanical or physical shock is a sudden acceleration or deceleration caused by, for example, impact, drop, kick, and so forth. In addition to, or alternatively, mechanical shock can cause breakage or fracture of various elements within the MEMS device permanently degrading long-term reliability of the MEMS device. Thus, mechanical shock can cause severe reliability problems in the structure of a MEMS device.

The microelectronic device industry is increasingly moving toward integrating multiple sensors into a single device package in order to reduce cost and form factor. In one such multiple sensor device package, a single MEMS semiconductor die may contain both accelerometer and angular rate sensors. Angular rate sensors, also referred to as gyroscopes, require operation in a vacuum atmosphere in order to achieve a high quality factor, Q, for low voltage operation and high signal response. Conversely, accelerometers require operation in a damped mode, i.e., in a non-vacuum environment, in order to avoid an under-damped reaction in which movable elements of the device can undergo multiple oscillations in response to a single disturbance.

Two types of devices having different pressure requirements pose significant problems with regard to their integration into a single device package. For example, in a multiple sensor package that includes both an angular rate sensor and an accelerometer, the vacuum environment needed to achieve high Q for the angular rate sensor can result in the accelerometer operating in an under-damped mode. An under-damped mode of operation for an accelerometer can intensify an oscillatory response in the moveable element due to vibration or mechanical shock thereby increasing the potential for stiction failure.

Embodiments entail microelectromechanical systems (MEMS) devices with enhanced resistance to stiction in both an unpowered and a powered stage. In particular, embodiments entail a MEMS device having a movable element that is suspended above a substrate by a spring member designed with a higher mechanical spring constant than the nominal spring constant called for by a sensitivity specification for the MEMS device. Embodiments further entail methodology for operating the MEMS device in which a relatively high voltage bias is applied to the sense electrodes during the powered stage to increase the sensitivity of the movable element by a spring softening effect. Closed-loop feedback control can be utilized to largely eliminate the resonance peak due to the under-damped response of the movable element during the powered stage. When a stiction condition is detected, the high voltage bias can be removed to enable recovery of the movable element from the stiction condition. The higher mechanical spring constant yields a stiffer spring having a larger restoring force in the unpowered stage in order to enable recovery from stiction. Additionally, the movable element has a higher natural frequency due to the relatively stiff spring which makes it less susceptible to interference from environmental vibration that would otherwise cause the movable element to resonate. Thus, the movable element of the MEMS device can effectively operate in a vacuum or low pressure environment in which an under-damped response could cause another device to operate ineffectively.

Figure 2:
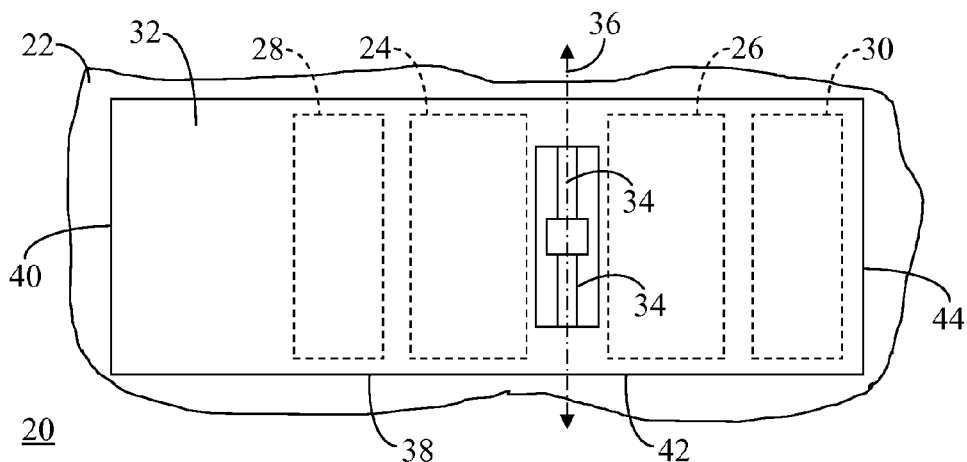
FIG. 2 shows a top view of the MEMS device of FIG. 1.

Referring to FIGS. 1-2, FIG. 1 shows a side view of a microelectromechanical systems (MEMS) device 20 in accordance with an embodiment, and FIG. 2 shows a top view of the MEMS device 20. MEMS device 20 may be an asymmetric capacitive accelerometer constructed as a hinged or "teeter-totter" type sensor. Thus, for purposes of the following discussion, MEMS device 20 is referred to thereinafter as capacitive accelerometer 20. An asymmetric teeter-totter type sensor is described herein for clarity and ease of description. However, features described herein for enhancing stiction resistance need not be limited to teeter-totter type sensors, but may alternatively be adapted for use in lateral displacement sensors where stiction can occur between a movable element and laterally displaced fixed elements facing the movable element. As such, it will become apparent that alternative embodiments can include a multiplicity of MEMS device designs having movable elements in which enhanced resistance to stiction may be called for.

Capacitive accelerometer 20 includes a substrate 22 having at least one electrode, in the form of two sense electrodes 24 and 26 formed on substrate 22. Capacitive accelerometer 20 includes additional electrodes, in the form of force feedback electrodes 28 and 30 formed on substrate 22. A movable element 32, commonly referred to as a "proof mass," is flexibly suspended above substrate 22 by a torsional suspension element, referred to herein as a spring member 34. Movable element 32 rotates about a rotational axis, represented in FIG. 2 by a bi-directional arrow 36. It should be understood that a number of flexures, hinges, and other rotational mechanisms may be utilized to enable pivotal movement of movable element 32 about rotational axis 36.

Sense electrode 24 is electrically isolated from sense electrode 26. Likewise, force feedback electrode 28 is electrically isolated from force feedback electrode 30. Sense electrodes 24 and 26 and feedback electrodes 28 and 30 underlie movable element 32. Accordingly, in the top view of FIG. 2 in which the electrodes would not normally be visible, electrodes 24, 26, 28, and 30 are represented by dashed lines to illustrate their locations relative to movable element 32 and rotational axis 36.

A moment, or tendency to produce motion about rotational axis 36, on movable element 32 needs to be created in order for capacitive accelerometer 20 to perform its sensing function. A section 38 of movable element 32 extending between rotational axis 36 and an end 40 of movable element is formed with relatively greater mass than a section 42 of movable element 32 extending between rotational axis 36 and an opposing end 44 of movable element 32. The greater mass of section 38 can be created by offsetting rotational axis 36 from a geometric center of movable element 32. In alternative embodiments, the greater mass of section 38 relative to section 42 may be created when rotational axis 36 is centered by, for example, forming apertures extending through section 42, adding material to section 38, and/or some combination thereof.

Due to the imbalance of masses on either side of rotational axis 36, a rotational moment is produced by an input acceleration, $A_{IN}$, represented by an arrow 46, to pivot movable element 32 about rotational axis 36. As movable element 32 rotates, its position relative to sense electrodes 24 and 26 and to force feedback electrodes 28 and 30 varies. The rotational change results in changes in the electrical capacitances between movable element 32 and each of sense electrodes 24 and 26. A capacitor 48, labeled C1, and a capacitor 50, labeled C2, shown in FIG. 1 represent these capacitances respectively. It should be understood that capacitors 48 and 50 are symbolic of this capacitance, and are not physical components of accelerometer 20. Thus, the reference numerals 48 and 50 refer to capacitance signals hereinafter.

The sensing function is therefore realized by detecting the differential capacitance signal between capacitance signal 48 and capacitance signal 50 formed between corresponding sense electrodes 24 and 26 and movable element 32. Accordingly, sense electrodes 24 and 26 detect a sense signal, i.e. capacitance signals 48 and 50, which are received at an associated application specific integrated circuit, i.e., an I/O circuit chip 52.

In an embodiment, the system is a closed-loop architecture that functions to keep movable element 32 approximately centered at its reference position within its linear operating range. That is, MEMS device 20 uses a negative feedback technique to try to maintain capacitance signal 48, C1, equal to capacitance signal 50, C2. When a capacitive mismatch is detected between capacitance signals 48 and 50 by circuitry on I/O circuit chip 52, force feedback voltages 56, labeled $V_{FF+}$ and $V_{FF-}$, are applied to force feedback electrodes 28 and 30. Force feedback voltages 56 create electrostatic forces which, in turn, produce a rotational moment that rotates movable element 32 to counteract the capacitive mismatch between capacitance signals 48 and 50. Thus, when the closed-loop system is operating properly, the position (i.e., rotation) of movable element 32 is actively being regulated to a fixed position. The feedback loop actively regulates the position of movable element 32 so that the moment generated by input acceleration 46 is counteracted by the moment generated by force feedback voltages 56 at force feedback electrodes 28 and 30. The force feedback signal is suitably processed to obtain an output acceleration signal 54, labeled $A_{OUT}$. Through the implementation of a force feedback architecture for MEMS device 20, movable element 32 is less likely to become unstable and pivot.

Excessive input acceleration 46 due to, for example, mechanical shock, can cause excessive pivotal motion of movable element 32 outside of its nominal operating range. This pivotal motion of movable element 32 may be stopped when either section 38 or 42 contacts the underlying substrate 22. Alternatively, movable element 32 may include stops (not shown) extending below a bottom surface of movable element 32. Thus, pivotal motion of movable element 32 may be stopped when the stops contact the underlying substrate 22. This contact with the underlying substrate 22 may result in the temporary or permanent adhesion of movable element 32 to substrate 22, referred to as stiction.

In accordance with an embodiment, a spring softening voltage 58, labeled $V_S$, is applied to sense electrodes 24 and 26 from I/O circuit chip 52. In general, spring member 34 is relatively stiff. Spring softening voltage 58 is applied to sense electrodes 24 and 26 to change or shift the initial stiffness of spring member 34 (in an unpowered mode) to an operating stiffness (in a powered mode) that is less than the initial stiffness of spring member 34. Accordingly, this change or reduction in stiffness of spring member 34 can be readily implemented when accelerometer 20 is operated in an underdamped mode, such as in a vacuum environment, in order to reduce to potential for stiction failure.

In an embodiment, MEMS device 20 includes sense electrodes 24 and 26 at which capacitance signals 48 and 50 are detected and spring softening voltage 58 is applied. Additionally, MEMS device 20 includes force feedback electrodes 28 and 30 at which force feedback voltage 56 is applied. In alternative embodiments, sensing, spring softening, and force feedback operations may be combined on the same pair of electrodes by, for example, time interleaving. In a time interleaving scenario, the system repeatedly progresses through sense, force, and softening phases.

Figure 3:
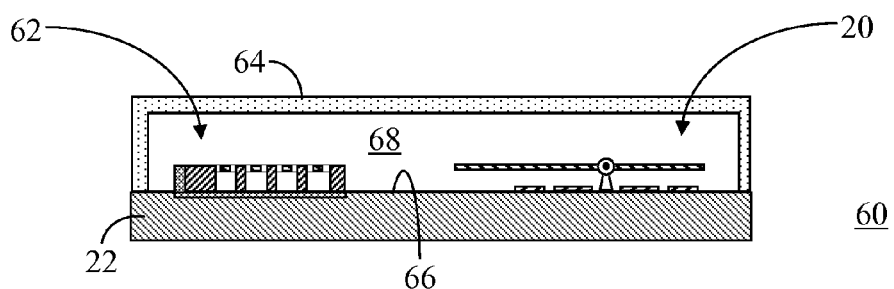
FIG. 3 shows a side view of a semiconductor package which may include the MEMS device of FIG. 2.

FIG. 3 shows a side view of a semiconductor package 60 which may include capacitive accelerometer 20. Semiconductor package 60 is provided to illustrate an environment in which accelerometer 20 may be located. In general, semiconductor package 60 includes substrate 22 at which accelerometer 20 and an angular rate sensor 62 are located. A cap 64 is coupled to a surface 66 of substrate 22. In the illustrative embodiment, cap 64 includes a cavity 68 formed therein. Cap 64 is bonded or otherwise coupled to surface 66 of substrate 22 such that cavity 68 is hermetically sealed and isolated from the external environment. Thus, cavity 68 is suitably sealed to largely prevent entry of water vapor and/or foreign bodies so as to maintain the proper functioning and reliability of accelerometer 20 and angular rate sensor 62.

It will be appreciated that angular rate sensor 62 can include one or more movable elements suspended above substrate 22 by, for example, suspension springs (not shown). Additionally, angular rate sensor 62 may additionally include one or more non-illustrated fixed and moving electrodes. Indeed, the specific structure and configuration of angular rate sensor 62 may vary. However, a description of the specific structure and configuration of angular rate sensor 62 is not needed to enable or fully describe the present embodiment, and is thus not described in further detail.

As discussed above, some MEMS devices require operation in a vacuum atmosphere in order to achieve a high quality factor, Q, for low voltage operation and high signal response. Conversely, other MEMS devices require operation in a damped mode, i.e., in a non-vacuum environment, in order to avoid an under-damped reaction in which movable elements of the device can undergo multiple oscillations in response to a single disturbance. These MEMS devices, having different cavity pressure requirements, pose significant problems when they are housed in the same cavity. For example, the vacuum environment of cavity 68 may be suitable for one MEMS device but could cause an under-damped response and instability in another MEMS device. Significant instability could cause a movable element of the MEMS device to move or rotate until it contacts the underlying substrate, resulting in the temporary or permanent adhesion of the movable element to the underlying substrate or lateral surfaces, i.e., stiction failure. Thus, the vacuum environment of cavity 68 places significant risk of failure on certain prior art MEMS devices.

Semiconductor package 60 includes angular rate sensor 62 and accelerometer 20, having different cavity pressure requirements, housed in the same cavity 68. The features of a stiff spring member 34, spring softening capability via spring softening voltage 58, closed loop control using force feedback voltage 56, and stiction condition detection (discussed below) yields a MEMS device, e.g., accelerometer 20, with enhanced resistance to stiction when in either a powered or unpowered mode.

Although semiconductor package 60 shows accelerometer 20 and angular rate sensor 62 housed in the same cavity 68, some package designs may contemplate a substrate upon which each sensor is formed but having different cavities within the cap, where each sensor is housed in a different cavity. Even though they are housed in separate cavities, the pressure within the cavity in which a MEMS device is positioned may still be low resulting in an under-damped response. Nevertheless, the features of a stiff spring member 34, spring softening capability, closed loop control using force feedback voltage, and stiction condition detection can still be implemented to yield a MEMS device, e.g., accelerometer 20, with enhanced resistance to stiction when in either a powered or unpowered state.

Figure 4:
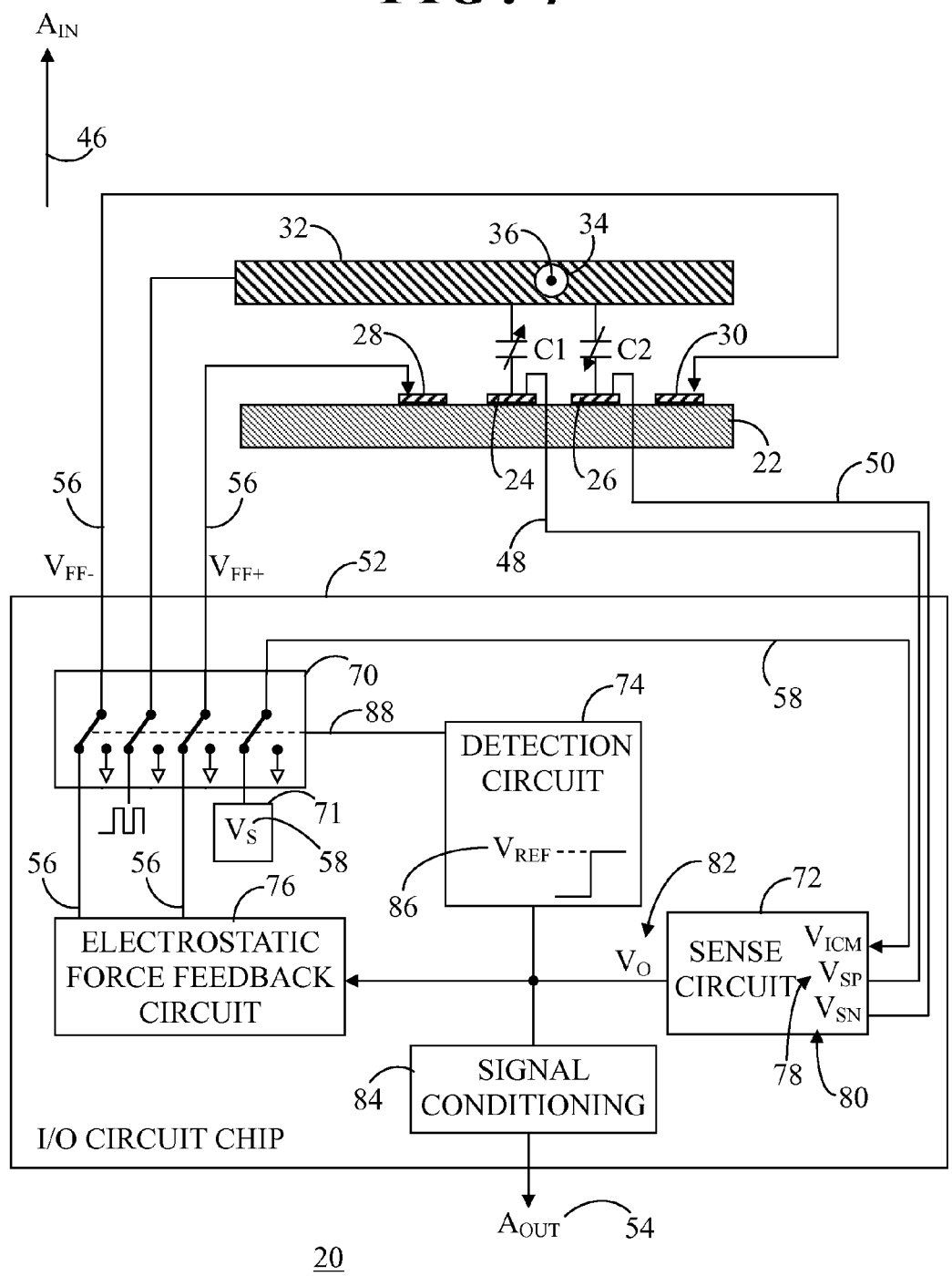
FIG. 4 shows a block diagram of the MEMS device of FIG. 1.

FIG. 4 shows a block diagram of the MEMS device of FIG. 1, i.e., accelerometer 20. Accelerometer 20 may be included within a multi-sensing inertial sensor package that includes one or more accelerometers and one or more angular rate sensors. The components of such a multi-sensing inertial sensor packaging are not illustrated herein for clarity. I/O circuit chip 52 of accelerometer 20 includes a multiplexor circuit 70, a sense circuit 72, a detection circuit 74, and an electrostatic force feedback circuit 76. Circuits 70, 72, 74, and 76 are illustrated as separate elements for ease of explanation. Those skilled in the art will recognize that the functions of elements 70, 72, 74, and 76 may be combined in any of a variety of configurations.

A voltage source 71 is in communication with sense electrodes 24 and 26 via multiplexor circuit 70 and sense circuit 72. That is, spring softening voltage 58 is input as a common mode voltage, $V_{ICM}$, to sense circuit 72. In an embodiment, a sense voltage 78, labeled $V_{SP}$, corresponding to capacitance signal 48 and a sense voltage 80, labeled $V_{SN}$, corresponding to capacitance signal 50, are "virtual grounds." That is, amplifiers (not shown) in sense circuit 72 hold each of sense voltages 78 and 80 for sense electrodes 24 and 26 at the same value as the input $V_{ICM}$, i.e., as spring softening voltage 58. Accordingly, spring softening voltage 58 is applied to sense electrodes 24 and 26 during a normal mode of operation. The application of spring softening voltage 58 is represented in FIG. 4 by a leftward position of a switch element in multiplexor circuit 70 between voltage source 71 supplying spring softening voltage 58 and the input at sense circuit 72 for $V_{ICM}$. The application of spring softening voltage 58 to sense electrodes 24 and 26 results in a different potential at sense electrodes 24 and 26 than the potential of movable element 32. This differing potential effectively reduces the stiffness, i.e., the mechanical spring constant, of spring member 34 to meet a predetermined operational stiffness for spring member 34, where the operational stiffness defines a sensitivity of movable element 32 to a magnitude of an input stimulus, i.e., input acceleration 46.

Sense circuit 72 is electrically coupled to sense electrodes 24 and 26. Sense circuit 72 is configured to receive capacitance signals 48 and 50 produced between movable element 32 and the underlying sense electrodes 24 and 26. Since the system is closed loop, I/O circuit chip 52 tries to maintain capacitance signal 48 equal to capacitance signal 52. In order to do so, an amplifier at sense circuit 72 drives sense voltages 78 and 80 (corresponding to capacitance signals 48 and 50) to be equal to $V_{ICM}$, i.e., spring softening voltage 58. Since sense voltages 78 and 80 are being held at the same potential, an output voltage signal, labeled $V_O$, can be obtained by measuring the difference in charge required to hold sense voltages 78 and 80 at spring softening voltage 58. Voltage output signal 82 may be communicated to a signal conditioning element 84 to where it is suitably processed in a conventional manner to generate an output signal, e.g., output acceleration signal 54, which is proportional to input acceleration 46.

Electrostatic force feedback circuit 76 is interposed between sense circuit 72 and force feedback electrodes 28 and 30. Force feedback circuit 76 is implemented to control force feedback voltage 56 ($V_{FF+}$ and $V_{FF-}$) applied to force feedback electrodes 28 and 30 in response to voltage output signal 82, where voltage output signal 82 is based upon, i.e., derived from, capacitance signals 48 and 50. Thus, accelerometer 20 is a "closed loop" design configured to largely eliminate the resonance peak of accelerometer 20 while it is powered on. Additionally, the "closed loop" design can largely cancel any temperature and/or time dependent offset caused by package stress such that a position of movable element 32 is substantially constant.

Sense circuit 72 is additionally electrically coupled to detection circuit 74, and detection circuit 74 is electrically coupled to multiplexor circuit 70. Voltage output signal 82, i.e., $V_O$, may be communicated to detection circuit 74 to determine whether movable element 32 is being subjected to a stiction condition. A stiction condition refers to a scenario in which movable element 32 has been subjected to mechanical shock or vibration sufficient to cause pivotal movement of movable element 32 about rotational axis 36 to exceed a predetermined limit or range of movement such that movable element 32 adheres at least temporarily to substrate 22. Thus, a stiction condition can contribute to sensor functional degradation and eventual failure should movable element 32 permanently adhere to substrate 22.

Detection circuit 74 provides detection and control to ensure quick recovery from a stiction condition, i.e., a mechanical shock event resulting in stiction. In an embodiment, detection circuit 74 may compare voltage output signal 82 to a reference voltage 86. When voltage difference signal 82 exceeds reference voltage 86 for a predetermined amount of time, detection circuit 74 registers a stiction condition, and sends a disable signal 88 to multiplexor circuit 70. Disable signal 88 effectively disables or deactivates voltage source 71 so that spring softening voltage 58 is removed from sense electrodes 24 and 26. In particular, all of electrodes 24, 26, 28, and 30 are set to the same potential as movable element 32. The removal of spring softening voltage 58 and setting all of electrodes 24, 26, 28, and 30 and movable element 32 to an equivalent voltage potential is demonstrated in FIG. 4 by a number of switch elements in multiplexor circuit 70 being switched rightward, for example, all terminals 24, 26, 28, 30, and 32 may be set to ground. Setting all terminals 24, 26, 28, 30, and 32 to the same potential allows spring member 34 to return to its initial, or unpowered, stiffness to thereby enable movable element 32 to return to its default position and recover from a stiction condition.

Figure 5:
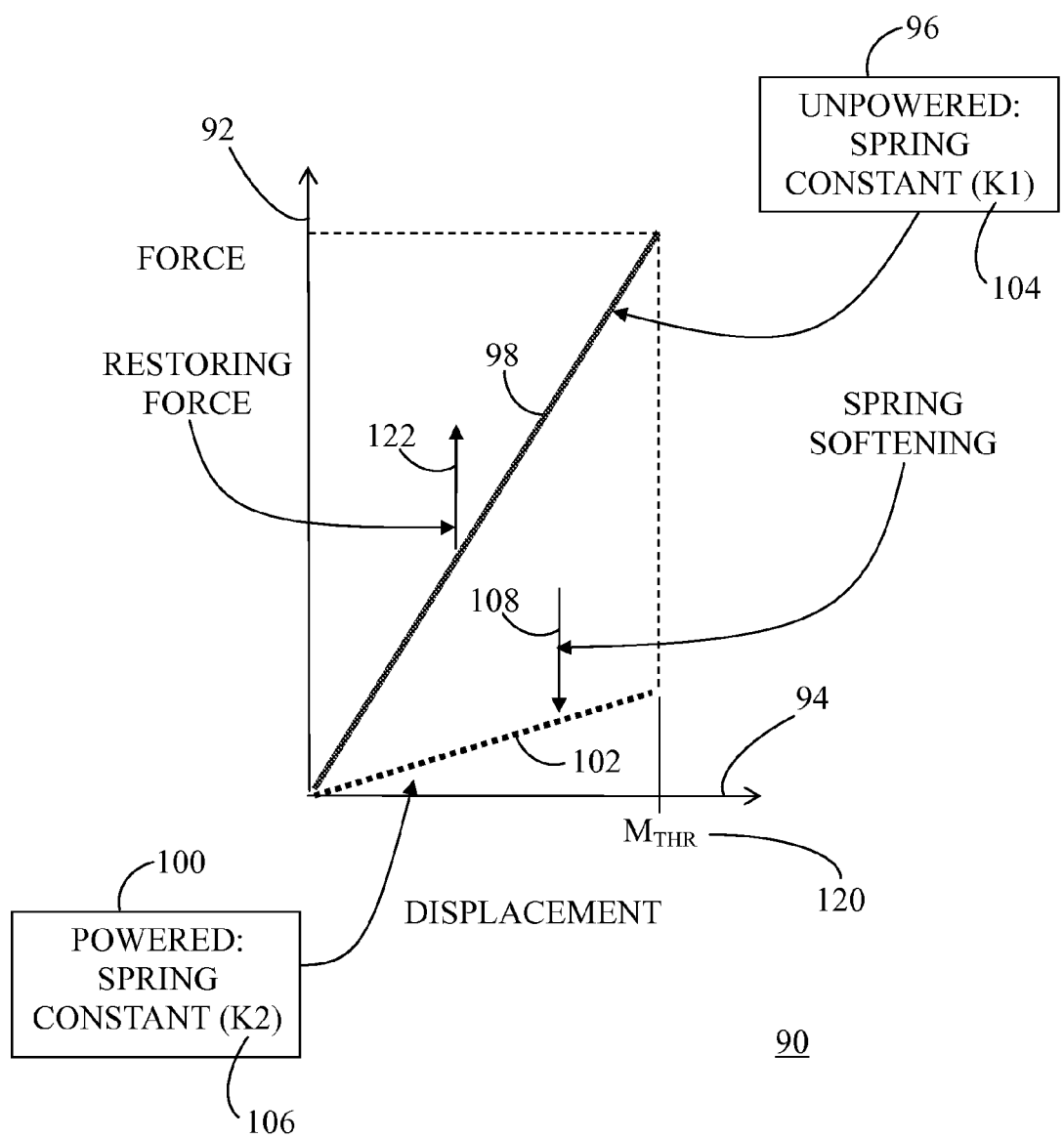
FIG. 5 shows a chart illustrating a change in spring stiffness with different operating modes of the MEMS device.

FIG. 5 shows a chart 90 illustrating a change in spring stiffness with different operating modes of the MEMS device, i.e., accelerometer 20 (FIG. 1). More particularly, chart 90 illustrates a magnitude of applied force 92 needed to achieve an amount of spring displacement 94 (i.e., torsion) relative to a spring stiffness, where the spring stiffness is defined by a spring constant for spring member 34. In an unpowered mode 96 of accelerometer 20, spring displacement 94 in response to applied force 92 is represented by a solid line 98. In a powered mode 100 of accelerometer 20, spring displacement 94 in response to applied force 92 is represented by a dotted line 102. Chart 90 represents spring stiffness within a usable, linear range for spring member 34. Those skilled in the art will recognize that spring stiffness becomes nonlinear at extremes of deformation.

In general, the spring constant of an elastic spring, e.g., spring member 34, is the ratio of the force applied on the spring to the resulting displacement. As is known to those skilled in the art, it is the constant of proportionality, k, which appears in Hooke's law for springs. A spring constant 104, labeled K1, defines the actual or initial stiffness of spring member 34 in unpowered mode 96 when spring softening voltage 58 (FIG. 1) is not being applied to sense electrodes 24 and 26, respectively. A spring constant 106, labeled K2, defines an effective stiffness of spring member 34 in powered mode 100 when spring softening voltage 58 (FIG. 1) is currently being applied to sense electrodes 24 and 26, respectively.

Accelerometer 20 is designed to include spring member 34 having a much higher mechanical spring constant than the nominal spring constant target, i.e., the predetermined operational stiffness, called for by the sensitivity specification for accelerometer 20. For example, an initial stiffness of spring member 34 resulting from spring constant 98 is at least two times greater (and may be in the range of two to five times greater) than a predetermined operational stiffness for spring member 34. Thus, the initial stiffness of spring member 34 is demonstrated by solid line 98.

Spring softening voltage 58 (FIG. 1) is sufficiently high to "soften," i.e., cause spring member 34 to become less stiff. In an embodiment, a stiffness of spring member 34 is shifted, i.e., reduced, from spring constant 104 in unpowered mode 96 to spring constant 106 in powered mode 100. In an embodiment, spring constant 106 can be reduced so that the effective stiffness of spring member 34 is approximately equivalent to the predetermined operational stiffness called for by the sensitivity specification for accelerometer 20. Thus, the effective stiffness as well as the predetermined operational stiffness are demonstrated by dotted line 102. Accordingly, chart 90 exemplifies a spring softening effect 108 in powered mode 100 which results in greater displacement 94 of spring member 34 (FIG. 1) in response to lower applied force 92 from an external stimulus, e.g., input acceleration 46 (FIG. 1).

Referring consecutively to FIGS. 6-8, FIGS. 6-8 illustrate a method of operating the MEMS device of FIG. 1, i.e., accelerometer 20. More particularly, FIG. 6 shows a block diagram of accelerometer 20 experiencing normal operation 110, FIG. 7 shows a block diagram of accelerometer 20 experiencing a stiction condition 112, and FIG. 8 shows a block diagram of accelerometer 20 undergoing a recovery event 114 following stiction condition 112.

Under normal operation 110, shown in FIG. 6, spring softening voltage 58 is applied to sense electrodes 24 and 26 via the common mode voltage, $V_{ICM}$, at sense circuit 72 (FIG. 4) in order to shift, and in this case reduce, the stiffness of spring member 34 from spring constant 104 (FIG. 5) to spring constant 106 (FIG. 5). In this example, spring softening voltage 58 may be approximately seven volts. During normal operation 110, movable element 32 resides at a reference, or default, position 116 in which it does not contact substrate 22. In response to input acceleration 46, a moment is produced about movable element 32 that is counteracted by force feedback voltages 56 so as to maintain its position at reference position 116. The amount of feedback voltage 56 needed to maintain movable element 32 at reference position 116 is proportional to input acceleration 46 and can be suitably processed to produce output acceleration signal 54. This sensing feature is thus performed while spring softening voltage 58 is applied to sense electrodes 24 and 26.

Force feedback voltage 56 is applied to force feedback electrodes 28 and 30 during normal operation 110. Resonance peak, i.e., mechanical resonance, is the tendency of a mechanical system to respond at a greater amplitude when the frequency of its oscillations matches the matches the system's natural frequency of vibration (i.e., its resonance frequency or resonant frequency) than it does at other frequencies. The resonance peak of movable element 32 can result in oscillation of movable element 32 sufficient to cause stiction. Accordingly, the closed loop sensing architecture of force feedback circuit 76 (FIG. 4) and application of force feedback voltage 56 can eliminate the resonance peak, and reduce the potential for stiction, of movable element 32 when accelerometer 20 is in powered mode 100 (FIG. 5).

Stiction condition 112, shown in FIG. 7, represents a situation where accelerometer 20 is subjected to a sudden acceleration or deceleration, referred to as a shock event and represented by a heavy, solid line 118. Stiction condition 112 can occur when accelerometer 20 contacts substrate 22 in response to mechanical or physical shock from, for example, impact, drop, kick, and so forth. Stiction condition 112 is provided to demonstrate stiction detection and a reset triggered by detection circuit 74 (FIG. 4) when stiction condition 112 is detected. As described above, stiction condition 112 can be determined when voltage signal 82 (FIG. 4) derived at sense circuit 72 (FIG. 4) from capacitance signals 48 and 50 exceeds an overload threshold, i.e., reference voltage 86 (FIG. 4) for greater than a predetermined period of time. An overload threshold value 120, illustrated in FIG. 5, represents a maximum displacement of spring member 34 beyond which movable element 32 will move outside of an allowable movement range for proper operation.

When stiction condition 112 is detected, all terminals 24, 26, 28, 30, and 32 are set to the same potential, effectively removing spring softening voltage 58 from sense electrodes 24 and 26. The removal of spring softening voltage 58 and the setting of all electrodes 24, 26, 28, and 30 to the same potential as movable element 32 is illustrated by an application of 0V in FIG. 7 to electrodes 24, 26, 28, and 30 and to proof mass 32. Sense electrodes 24 and 26 are pulled to ground, i.e., 0V, in this example by sense circuit 72 (FIG. 4) in order to shift, and in this case increase, the stiffness of spring member 34 from spring constant 106 (FIG. 5) to spring constant 104 (FIG. 5).

The greater stiffness of spring member 34 in unpowered mode 96 enables a restoring force 122 (see FIG. 5) resulting from the higher spring constant 104 of spring member 34 to be imposed on movable element 32. This higher restoring force 122 allows movable element 32 to return to reference position 116 (FIG. 6), thereby enhancing a resistance of movable element 32 to a permanent stiction condition. Thus, a benefit of the implementation of spring softening is that spring constant 104 in unpowered mode 96 is higher than spring constant 106 in powered mode 100. This translates to reduced probability of stiction, i.e., enhanced resistance to stiction, and higher shock tolerance in unpowered components, as well as recovery from stiction condition 112 in powered components.

Recovery event 114, shown in FIG. 8, represents the period during which movable element 32 returns to reference position 116. During recovery event 114, force feedback voltages 56 from force feedback circuit 76 (FIG. 4) may be supplied to force feedback electrodes 28 and 30. Force feedback voltages 56 can provide electrical damping and thereby suppress ringing, or oscillation, of movable element 32 during its return to reference position 116. Spring softening voltage 58 can be reapplied to sense electrodes 24 and 26 to shift, i.e., reduce, the stiffness of spring member 34 from spring constant 104 (FIG. 5) to spring constant 106 (FIG. 5) and thereby return accelerometer 20 to normal operation 110 (FIG. 6).

In summary, embodiments of the invention entail microelectromechanical systems (MEMS) devices with enhanced resistance to stiction in both an unpowered and a powered stage. In particular, embodiments entail a MEMS device having a movable element that is suspended above a substrate by a spring member designed with a higher mechanical spring constant than the nominal spring constant called for by a sensitivity specification for the MEMS device. Embodiments further entail methodology for operating the MEMS device in which a relatively high voltage bias is applied to the sense electrodes during the powered stage to increase the sensitivity of the movable element by a spring softening effect. Closed-loop feedback control can be utilized to largely eliminate the resonance peak due to the under-damped response of the movable element during the powered stage. When a stiction condition is detected, the high voltage bias is removed to enable recovery of the movable element from the overload condition. The higher mechanical spring constant yields a stiffer spring having a larger restoring force in the unpowered stage in order to enable recovery from stiction. Additionally, the movable element has a higher natural frequency due to the relatively stiff spring which makes it less susceptible to interference from environmental vibration that would otherwise cause the movable element to resonant. Thus, the movable element of the MEMS device can effectively operate in a vacuum or low pressure environment in which an under-damped response would otherwise cause another device to operate ineffectively.

Although the preferred embodiments of the invention have been illustrated and described in detail, it will be readily apparent to those skilled in the art that various modifications may be made therein without departing from the spirit of the invention or from the scope of the appended claims. That is, it should be appreciated that the exemplary embodiments are only examples, and are not intended to limit the scope, applicability, or configuration of the invention. For example, spring members with a high mechanical spring constant than that called for by a sensitivity specification and the closed-loop system described above may be implemented in MEMS devices that have suspended movable elements configured to move lateral, i.e., substantially parallel, to the underlying substrate.

What is claimed is:

1. A microelectromechanical systems (MEMS) device comprising:
    a substrate;
    a movable element positioned in spaced apart relationship above a surface of said substrate;
    at least one spring member interconnecting said movable element with said substrate, said at least one spring member enabling motion of said movable element, and said at least one spring member exhibiting a first stiffness;
    at least one electrode facing said movable element;
    at least one force feedback electrode facing said movable element;
    a voltage source in communication with said at least one electrode, said voltage source being configured to apply a spring softening voltage to said at least one electrode to shift a stiffness of said spring member from said first stiffness to a second stiffness, said second stiffness being less than said first stiffness;
    a sense circuit in electrical communication with said at least one electrode for generating an electrical output signal in response to an input stimulus imposed on said movable element;
    an electrostatic force feedback circuit interposed between said sense circuit and said at least one force feedback electrode for controlling a feedback voltage applied to said at least one force feedback electrode based on said electrical output signal;
    a detection circuit in electrical communication with said at least one electrode, said detection circuit being configured to detect a stiction condition of said movable element in response to an output signal from said at least one electrode; and
    a multiplexor circuit in communication with said at least one electrode, said at least one force feedback electrode, and said movable element, said multiplexor circuit being configured to set each of said at least one electrode, said at least one force feedback electrode, and said movable element to an equivalent voltage potential to effectively remove said spring softening voltage in response to said stiction condition.

2. A MEMS device as claimed in claim 1 wherein said movable element is configured to move in response to an input stimulus while said spring softening voltage is applied to said at least one electrode.

3. A MEMS device as claimed in claim 1 wherein:
said movable element is adapted for motion relative to a rotational axis positioned between first and second ends of said movable element, a first section of said movable element is formed between said rotational axis and said first end, a second section of said movable element is formed between said rotational axis and said second end, said first section having a first mass that is greater than a second mass of said second section; and
said at least one electrode includes a first electrode facing said first section of said movable element and a second electrode facing said second section of said movable element, and said spring softening voltage is applied to each of said first and second electrodes.

4. A method of operating a microelectromechanical systems (MEMS) device that includes a movable element positioned in spaced apart relationship above a surface of a substrate, at least one spring member interconnecting said movable element with said substrate, at least one electrode facing said movable element, wherein said at least one spring member enables motion of said movable element, said at least one spring member exhibits a first stiffness, and said method comprises:
applying a spring softening voltage to said at least one electrode to shift a stiffness of said spring member from said first stiffness to a second stiffness, said second stiffness being less than said first stiffness;
detecting a stiction condition of said movable element from an output signal provided from said at least one electrode, said stiction condition indicating that said movable element has moved beyond an allowable movement range, wherein said detecting operation comprises determining that said output signal exceeds an overload threshold value; and
removing said spring softening voltage from said at least one electrode in response to said stiction condition to shift said stiffness of said spring member from said second stiffness to said first stiffness to thereby enable said movable element to return to a first position within said allowable movement range.

5. A method as claimed in claim 4 further comprising sensing an input signal as a function of an input stimulus imposed on said movable element, said sensing operation being performed while said spring softening voltage is applied to said at least one electrode.

6. A method as claimed in claim 4 further comprising:
following said removing operation, detecting return of said movable mass to said first position; and
reapplying said spring softening voltage to said at least one electrode to shift said stiffness of said spring member from said first stiffness to said second stiffness.

7. A method as claimed in claim 4 wherein said movable element is adapted for motion relative to a rotational axis positioned between first and second ends of said movable element, a first section of said movable element is formed between said rotational axis and said first end, a second section of said movable element is formed between said rotational axis and said second end, said first section having a first mass that is greater than a second mass of said second section, said at least one electrode includes a first electrode facing said first section of said movable element and a second electrode facing said second section of said movable element, and said applying operation applies said spring softening voltage to each of said first and second electrodes.

8. A method of operating a microelectromechanical systems (MEMS) device that includes a movable element positioned in spaced apart relationship above a surface of a substrate, at least one spring member interconnecting said movable element with said substrate, and at least one electrode facing said movable element, wherein said at least one spring member enables motion of said movable element, said at least one spring member exhibits a first stiffness, and said MEMS device further includes a sense circuit in electrical communication with said at least one electrode, at least one force feedback electrode facing said movable element, and an electrostatic force feedback circuit interposed between said sense circuit and said at least one force feedback electrode, and said method comprises:
applying a spring softening voltage to said at least one electrode to shift a stiffness of said spring member from said first stiffness to a second stiffness, said second stiffness being less than said first stiffness;
detecting a stiction condition of said movable element from an output signal provided from said at least one electrode, said stiction condition indicating that said movable element has moved beyond an allowable movement range; and
removing said spring softening voltage from said at least one electrode in response to said stiction condition to shift said stiffness of said spring member from said second stiffness to said first stiffness to thereby enable said movable element to return to a first position within said allowable movement range;
generating, at said sense circuit, an electrical output signal in response to an input stimulus imposed on said movable element;
controlling, at said force feedback circuit, a feedback voltage based on said electrical output signal; and
supplying said feedback voltage to said at least one force feedback electrode from said force feedback circuit.

9. A method as claimed in claim 8 wherein said removing operation comprises setting each of said at least one electrode, said at least one force feedback electrode, and said movable element to an equivalent voltage potential.

\* \* \* \* \*